United States Patent [19]

Thakur et al.

[11] Patent Number: 5,712,186
[45] Date of Patent: Jan. 27, 1998

[54] METHOD FOR GROWING FIELD OXIDE TO MINIMIZE BIRDS' BEAK LENGTH

[75] Inventors: Randhir P. S. Thakur, Boise; Michael Nuttall, Meridian; Pai-Hung Pan, Boise, all of Id.

[73] Assignee: Micron Technology, Inc., Boise, Id.

[21] Appl. No.: 662,852

[22] Filed: Jun. 12, 1996

[51] Int. Cl.$^6$ ................................ H01L 21/76
[52] U.S. Cl. .................. 437/69; 437/70; 437/24; 437/25; 437/26
[58] Field of Search .................. 437/69, 70, 72, 437/24, 25, 26

[56] References Cited

U.S. PATENT DOCUMENTS

| | | | |
|---|---|---|---|
| 4,398,992 | 8/1983 | Fang et al. | 156/643 |
| 5,182,226 | 1/1993 | Jang | 437/69 |
| 5,236,862 | 8/1993 | Pfiester et al. | 437/70 |
| 5,294,563 | 3/1994 | Rao | 437/69 |
| 5,393,693 | 2/1995 | Ko et al. | 437/69 |

FOREIGN PATENT DOCUMENTS

| | | | |
|---|---|---|---|
| 0111243 | 9/1981 | Japan | 437/72 |
| 0188938 | 10/1984 | Japan | 437/72 |
| 0110658 | 5/1988 | Japan | 437/69 |
| 0010835 | 1/1990 | Japan | 437/69 |
| 0043662 | 2/1992 | Japan | 437/72 |
| 0144805 | 6/1993 | Japan | 437/69 |

*Primary Examiner*—Trung Dang
*Attorney, Agent, or Firm*—Schwegman, Lundberg, Woessner & Kluth, P.A.

[57] ABSTRACT

A method for forming field oxide isolation regions using oxygen implantation is described. An oxidation resistant layer such as silicon nitride is formed on a silicon substrate, and acts as an oxidation mask. An opening is then formed in the nitride layer, where field oxide is desired. In one embodiment of the invention, oxygen is implanted into this opening, followed by thermal oxidation. In a second embodiment of the invention, the opening is thermally oxidized, followed by a deep oxygen implant and anneal. Encroachment of the field oxide under the nitride layer is decreased, resulting in a minimum "birds' beak" length.

27 Claims, 3 Drawing Sheets

METHOD FOR GROWING FIELD OXIDE TO MINIMIZE BIRDS' BEAK LENGTH

FIELD OF THE INVENTION

The present invention relates to methods for manufacturing semiconductor devices, and in particular for achieving a thick field oxide with a minimum "birds' beak" length.

BACKGROUND OF THE INVENTION

Field oxide layers electrically isolate semiconductor devices from one another. The most common technique for their formation is termed LOCOS isolation (for LOCal Oxidation of Silicon). Silicon dioxide ($SiO_2$) is formed on silicon surfaces through a process termed oxidation. In the formation of field oxides, $SiO_2$, is thermally grown to thicknesses of between 3,000 to 10,000 angstroms. Usually, oxidation is accomplished by exposing the silicon to an oxidant ambient, such as oxygen ($O_2$) or water ($H_2O$), at elevated temperatures. Oxide is formed on those areas which are not covered by an oxidation mask, such as silicon nitride.

Silicon nitride is deposited by chemical vapor deposition (CVD), and photolithographically patterned to form the oxidation mask, using a dry etch. Silicon nitride is an effective mask due to the slow speed with which oxygen and water vapor diffuse in the nitride (typically only a few tens of nanometers of nitride are converted to $SiO_2$ during the field oxide growth process). Therefore, the nitride layer thickness is selected according to the time needed for the field oxidation step. Typically, the nitride masking layer is deposited to a thickness of between 1,000 and 2,000 angstroms. After field oxidation, the masking layer is removed by a wet etch for subsequent device formation in the regions previously under the mask.

Field oxide layers function to prevent parasitic conditions between devices, such as punchthrough. Although punchthrough can be reduced by separating devices by adequate distances, field oxide layers are important in that they help to decrease this distance, by providing an electrical isolation layer. This is of great concern, especially in the manufacture of ultra large scale integrated (ULSI) circuits, where attempts are made to achieve semiconductor chips of maximum density mainly by scaling down line widths to make them narrower. Scaling down facilitates formation of leakage current paths, causing unwanted DC power dissipation, noise margin degradation, and voltage shift on a dynamic mode. Adequate electrical isolation between devices is necessary to prevent such problems.

Although field oxide layers presently provide many advantages in semiconductor technology, there are several problems created by their application to a ULSI circuit die, including "birds' beak" formation, as indicated in FIG. 1 at 110. Lateral oxidation from encroachment, or growth of oxide under the nitride edge 112, lifts the nitride layer 112 as it grows. This encroachment of the oxide between the nitride layer and the silicon substrate 114 forms a "birds' beak" structure 110, termed due to its slowly tapered shape. The effect from the "birds' beak" structure 110 is often called the narrow width effect. In order to minimize the "birds' beak" structure 110, a shorter oxidation time is required. When a short oxidation is used, the field oxide 116 thickness is reduced and the isolation properties for devices with small isolation are degraded. This effect limits the total number of devices that can be fit onto a single integrated circuit chip. A novel approach is required to apply the LOCOS process to ULSI circuits.

Another problem associated with the "birds' beak" structure is encountered during a later step of connecting metal to the source and drain regions of a MOS device. Any overetching during formation of the metal contact opening may expose the substrate regions under the source or drain region, shorting the device.

One approach to solving the problem of decreasing the "birds' beak" is to increase the $H_2/O_2$ ratio during wet oxidation. Another approach is high pressure oxidation. Another prior art method employs the use of sidewall spacers to minimize the "birds' beak" phenomenon, such as shown in U.S. Pat. No. 5,393,693 to Ko et al.

Ko et al. utilize $SiO_2$ spacers in the nitride layer opening in conjunction with several other processing techniques. The spacers act as lateral oxidation inhibitors. Oxygen implantation is employed as one of several complex steps taught by the '693 patent. Prior to oxygen implantation, the '693 patent requires etching a region of the silicon substrate to a depth of between 2,000 and 5,000 angstroms. In addition, oxidation is performed following deposition of a polysilicon layer, through which oxygen can diffuse, during oxidation in a non-oxidant, nitrogen ambient. The use of spacers does not lend itself well to reducing line widths, and is just one of several steps required to minimize the birds' beak effect.

There is a need for an effective method to minimize the "birds' beak" phenomenon, which results during growth of field oxide, utilizing fewer, less complicated steps and providing thermal cost saving steps. As devices get smaller, and more devices must be fit on each chip, any waste of precious chip space is very costly. Narrower line widths also reduce the density of oxidants available in openings in the nitride layer and hence make it difficult to obtain thick oxide growth. There is a need to minimize the encroachment of field oxide under nitride layers, to allow an increase in chip density. There is also a need to reduce the time required for thermal oxidation while still obtaining thick oxide growth.

SUMMARY OF THE INVENTION

A method of forming a field oxide in a semiconductor device produces minimal encroachment under a patterned oxidation resistant structure. The oxide is formed by oxygen implantation in conjunction with a subsequent anneal in an oxidant atmosphere. The reduction of encroachment uses fewer steps than prior art methods of enhancing oxygen implantation, resulting in a lower thermal budget. Less encroachment also allows closer spacing of semiconductor structures, permitting increased chip density.

In one embodiment of the invention, deposition of a silicon nitride mask layer is followed by an oxygen implant. The oxygen implant is followed by the growth of oxide on the exposed substrate. Very little oxide encroachment is seen as a result of this method. To further enhance the rate of oxidation, an oxidant ambient at a pressure of between approximately $4 \times 10^3$ to $20 \times 10^3$ Torr is used.

In a second embodiment of the invention, deposition of the silicon nitride mask layer is followed by thermal oxide growth on the exposed substrate. This is followed by an oxygen implant, through the oxide, into the underlying silicon. The wafers are then annealed to form field oxide of the desired thickness.

An additional benefit of the present invention is that field oxide is formed without added steps of etching the silicon substrate and deposition of a polysilicon layer, as done in prior art methods. A polysilicon layer is not needed to increase the rate of oxidation in the present invention because an oxidant ambient is used during the oxidation step. The oxidant ambient and the implanted oxygen provide two sources of oxygen, originating from both sides of the desired field oxide area, as compared with prior art techniques of providing the oxygen source solely form the oxygen implant area. Thus, the need for a polysilicon layer in the desired field oxide area has been removed.

By utilizing implantation of oxygen, this invention also helps to combat the oxide field-thinning effect. In submicron-isolation, field oxide thickness has typically been significantly less than the thickness of field oxides gown in wider spacings. In the present invention, the field-thinning effect is decreased due to an increase in the concentration of oxidants available in the opening, resulting from implantation of oxygen.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

Figure 1:
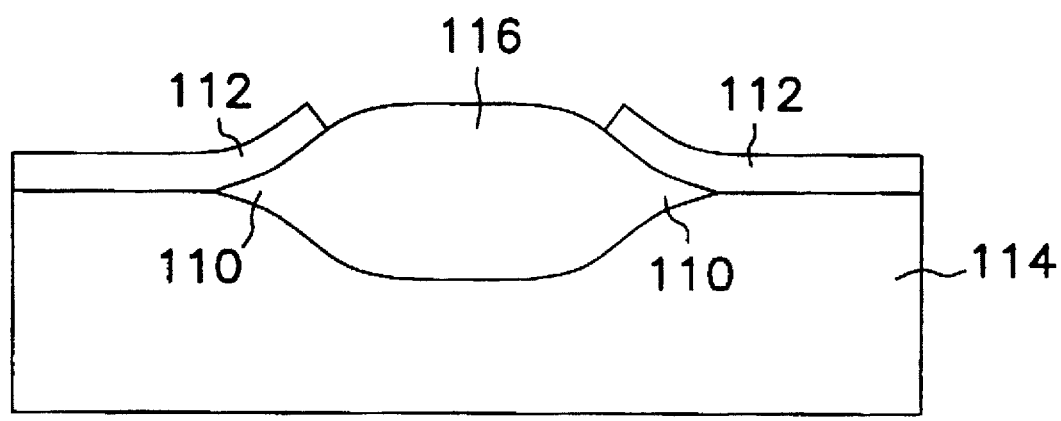
FIG. 1 is a prior art cross-sectional representation of a semiconductor substrate illustrating encroachment of field oxide between a silicon nitride layer and a silicon substrate.
Figure 2A:
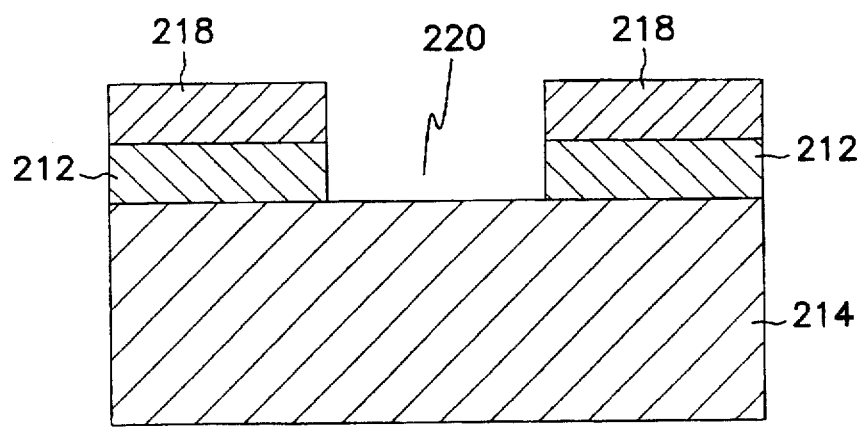
FIGS. 2a, b, and c are cross-sectional representations illustrating details of one embodiment of the invention, where an oxygen implant is followed by oxidation to form the field oxide.
Figure 3A:
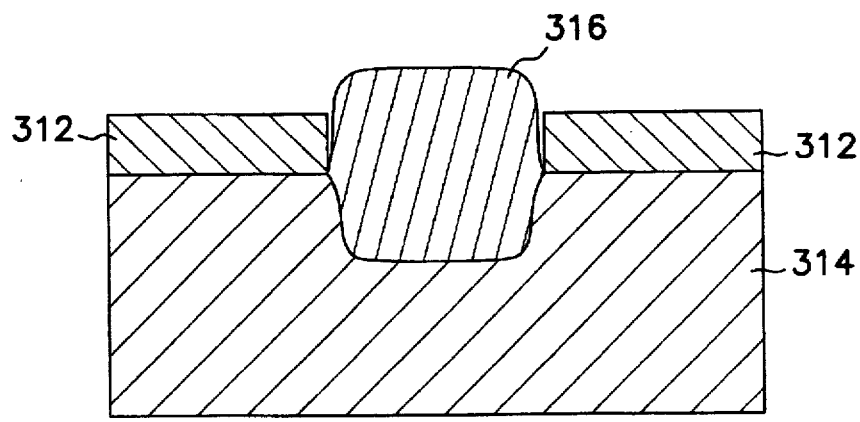
FIGS. 3a, b, and c are cross-sectional representations illustrating details of another embodiment of the invention, where thermal oxidation is followed by an oxygen implant and anneal to form the field oxide.

In both embodiments of the invention, an oxidation resistant mask layer 212 and 312, such as silicon nitride ($Si_3N_4$), is formed on a semiconductor substrate 214 and 314, as shown in FIGS. 2a and 3a. Prior to formation of the silicon nitride layer, an optional silicon dioxide ($SiO_2$) layer can be formed. The silicon nitride layers 212 and 312 are formed by exposing a silicon substrate 214 and 314 to a mixture of ammonium ($NH_3$) and dichlorosilane, or DCS ($SiH_2Cl_2$), comprised in a concentration ratio ranging between approximately 3:1 and 20:1 in a low pressure chemical vapor deposition (LPCVD) furnace. The LPCVD furnace is set at a temperature of between approximately 600 to 850 degrees Celsius and a pressure of between approximately a few milliTorr to $4 \times 10^3$ Torr. Higher pressures improve resulting masking properties. The silicon nitride layers 212 and 312 are formed to a thickness of between approximately 100 to 2,000 angstroms. However, variations can be made to the thickness and methods of formation of silicon nitride layers 212 and 312 without departing from the scope of the invention.

Figure 2B:
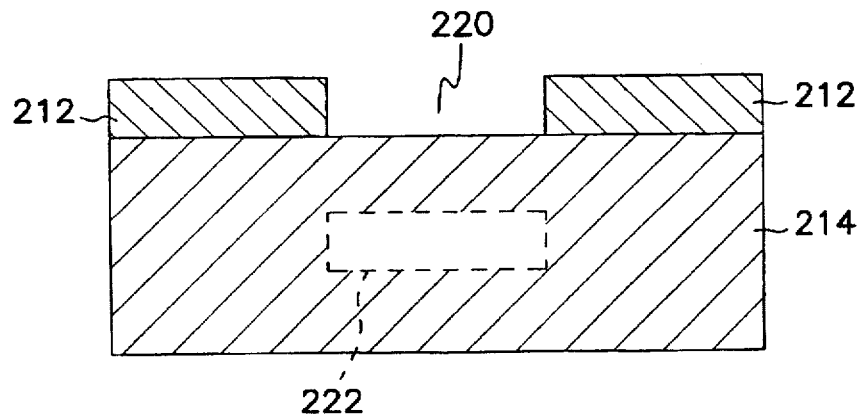
Figure 2C:
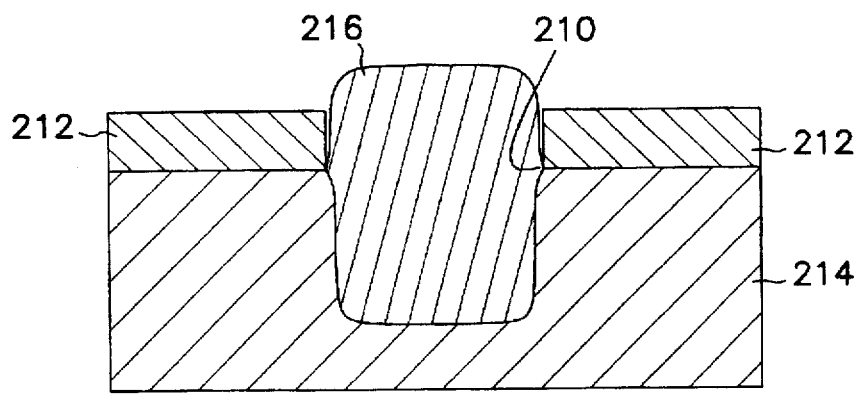

Subsequently, as shown in FIG. 2a, a photo mask 218 is applied to define the active device areas using standard photolithographic techniques well known in the art. The exposed silicon nitride layer is removed, using a dry etch to form a patterned oxidation resistant structure. When an optional silicon dioxide layer is utilized between the silicon substrate and the silicon nitride layer, the etch depth can comprise one of a number of options. The etch can be stopped when the pad oxide is reached, at the $SiO_2/Si$ interface, or slightly into the silicon substrate. FIGS. 2a-2c illustrate where the dry etch is stopped when the pad oxide is reached, as a silicon dioxide layer is not illustrated. Areas where silicon nitride is removed are nonactive device areas 220, in which field oxide is subsequently formed.

In one embodiment of the invention, to form field oxide, the next processing step is implanting oxygen into the substrate area 222, below the etched opening in the nitride layer 212, as shown in FIG. 2b. Oxygen is implanted to a depth of between approximately 1,000 to 10,000 angstroms at an implant energy of between approximately 100 to 500 keV. However, variations can be made to these depths and energies without departing from the scope of the invention. The implant energy to be used is easily determined by one skilled in the art from the desired depth of implantation and materials to be used. Lower energies can be achieved for a desired implant depth by aligning the substrate 214 during implantation to "channel" the implanted ions. Aligning a silicon substrate 214 along the <100>, <111>, and <110> channels, or slight deviations therefrom, respectively increases the amount of channeling achievable during implantation of silicon.

The oxygen implant step is followed by thermal oxidation. The oxidation method utilized in the present invention decreases the total time needed for oxidation. The shorter the oxidation time, the less field oxide encroachment will occur beneath the nitride layer 212, as shown in FIG. 2b. Oxidation can be achieved either in a dry or in a wet oxidant ambient, such as $O_2$ or $H_2O$ respectively, with or without ozone. The oxidant is selected from the group consisting of $O_2$, $O_3$, $CO_2$, $H_2O$, $N_2O$, and NO, and similar oxidants. Using an oxidant ambient eliminates the need to deposit a polysilicon layer over the substrate 214, through which the implanted oxygen can diffuse. Note that some encroachment may occur, and the Figures are not meant to accurately represent the amount of encroachment which may be obtained by practice of the invention.

In one embodiment, use of rapid thermal oxidation (RTO) provides for formation of ozone-free oxygen, further enhancing the rate of oxidation. Oxidizing in an atmospheric furnace, using an ozone-free, wet $H_2O$ ambient at a temperature of between approximately 900 to 1,150 degrees Celsius provides the oxygen needed to diffuse into the implanted region 222 to saturate any silicon dangle bonds in this area and to form a good quality thick $SiO_2$ layer 216, as shown in FIG. 2c. This oxidation process also allows the oxygen to diffuse through the implantation region, 222, as shown in FIG. 2b, to the area just below the implant region, forming a low stress $SiO_2/O_2$ interface 224. It is known that the density of the implanted oxygen into the silicon substrate 214 is independent of the field oxide 216 thickness. Therefore, field oxide 216 growth will be uniform throughout the entire desired thickness and reduce the differential field oxide growth problem, observed for non-implanted LOCOS (LOCal Oxidation of Silicon)structures. Thermal oxidation results in a field oxide layer 216 of a thickness between 1,000 to 10,000 angstroms, at a much shorter thermal oxidation time than previous methods, with minimal field oxide encroachment 210. For example, thermally oxidizing in an ozone-free, wet oxidant ambient at approximately 1,000 degrees Celsius, with the oxygen implant, takes approximately 13 minutes to form a layer approximately 4,000 angstroms thick. Thermally oxidizing in a similar environment, without the oxygen implant, takes approximately 90 minutes to form a layer of the same thickness. This shorter thermal oxidation time minimizes the resulting "birds' beak" length, as seen at 210 in FIG. 2e. In further embodiments of the invention, application of pressure during wet or dry oxidation of between approximately $4 \times 10^3$ to $20 \times 10^3$ Torr further increases the rate of oxidation, which results in less encroachment.

In a second embodiment of the invention, two oxidation steps are utilized in conjunction with similar steps of depositing a silicon nitride layer 312 to a thickness of between approximately 100 to 2,000 angstroms, photolithographic patterning, and etching at least one opening in the silicon nitride layer 213, as shown in FIG. 3a. An optional silicon dioxide layer between the silicon substrate 314 and the silicon nitride layer 312 may be utilized. The substrate 314 is then thermally oxidized in an atmospheric furnace, using an ozone-free, wet $H_2O$ ambient at a temperature of between approximately 900 to 1,150 degrees Celsius, to form an oxidized substrate 316 having a thickness of between approximately 750–1,500 angstroms. In further embodiments, oxidizing, using a wet or dry ambient, at a pressure of between approximately $4 \times 10_3$ to $20 \times 10^3$ Torr further increases the rate of oxidation. In all embodiments, the oxidant is selected from the group consisting of $O_2$, $O_3$, $CO_2$, $H_2O$, $N_2O$, and NO, and similar oxidants.

Figure 3B:
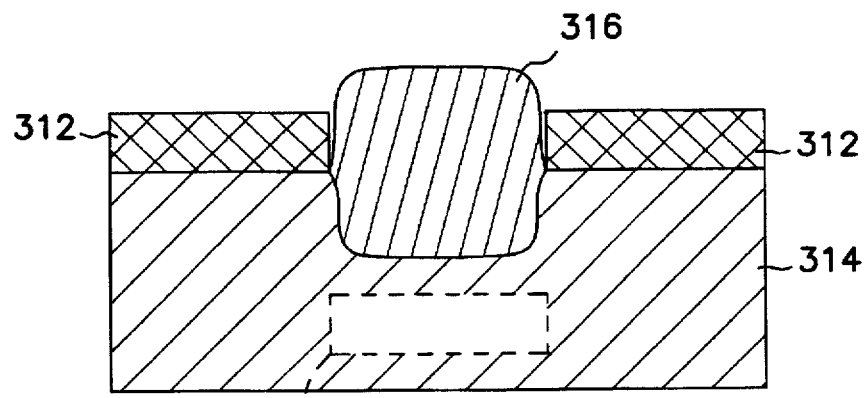

An oxygen implantation step follows this preliminary oxidation step, as shown in FIG. 3b, resulting in an oxygen-rich region 322 below the oxidized substrate 316. Oxygen is implanted into the substrate area 322 to a depth of between 1,000 to 10,000 angstroms at an implant energy of between approximately 100 to 500 keV. However, variations can be made to these depths and energies without departing from the scope of the invention. Once the desired depth is set, the implant energy is determined by ways well known to one skilled in the art.

Figure 3C:
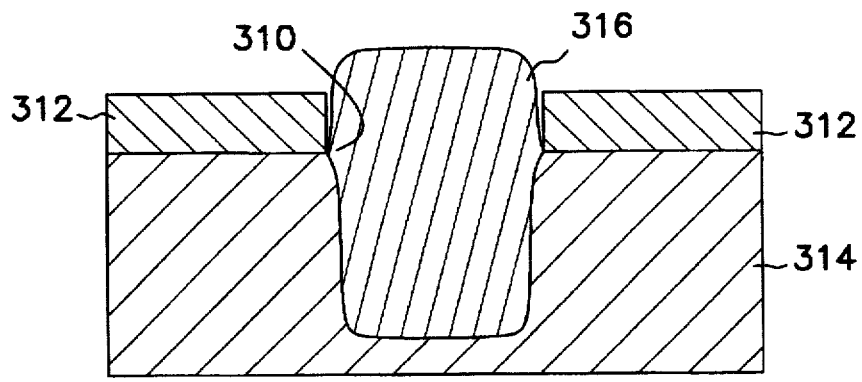

The second oxidation step in this embodiment comprises annealing the substrate 314 in an atmospheric furnace, set at between approximately 850 to 1,050 degrees Celsius comprising an ozone-free, wet $H_2O$ ambient, for approximately 2 hours to form field oxide 316, having an oxide thickness between 1,000 to 10,000 angstroms, as shown in FIG. 3c. In further embodiments, other oxidant ambients can be used, such as those selected from the group consisting of $O_2$, $O_3$, $CO_2$, $H_2O$, $N_2O$, and NO, and similar oxidants. Using this second embodiment of the invention also minimizes the "birds' beak" length, as seen at 310 in FIG. 3c due to the decreased amount of time needed for thermal oxidation at higher temperatures. Note that some encroachment may occur, and the Figures are not meant to accurately represent the amount of encroachment which may be obtained by practice of the invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for forming field oxide on a semiconductor substrate, comprising the steps of:

forming an oxidation resistant mask layer on the substrate;

etching the mask layer, creating at least one opening, which exposes the substrate;

oxidizing the substrate where it is exposed;

implanting oxygen into the opening at an energy level which implants the oxygen substantially below the oxidized substrate; and oxidizing the oxygen implanted substrate to form field oxide, having a desired field oxide thickness.

2. The method of claim 1, wherein the field oxide is comprised of silicon dioxide.

3. The method of claim 1, wherein the substrate comprises silicon.

4. The method of claim 1, wherein the substrate comprises silicon, having a silicon dioxide layer formed thereon.

5. The method of claim 1, wherein the mask layer is comprised of silicon nitride.

6. The method of claim 5, wherein the mask layer is formed to a thickness of between approximately 100 to 2,000 angstroms.

7. The method of claim 1, wherein oxygen is implanted in the substrate to a depth of between approximately 1,000 to 10,000 angstroms.

8. The method of claim 1, wherein the oxygen is implanted at an energy of between approximately 100 to 500 keV.

9. The method of claim 1, wherein the oxygen is implanted by channeling.

10. The method of claim 1, wherein the oxidizing the implanted substrate step is performed at a pressure of between approximately $4 \times 10^3$ to $20 \times 10^3$ Torr.

11. The method of claim 1, wherein the oxidizing the implanted substrate step is comprised of oxidizing at a temperature of between approximately 900 to 1,150 degrees Celsius, in an ambient selected from the group consisting of $O_2$, $O_3$, $CO_2$, $H_2O$, $N_2O$, and NO.

12. The method of claim 1, wherein the thickness of the filed oxide formed is between approximately 1,000 to 10,000 angstroms.

13. A method for field oxide growth on a semiconductor substrate, comprising the steps of:

forming an oxidation resistant mask layer over the substrate;

etching the mask layer, creating at least one opening, which exposes the substrate;

oxidizing the exposed substrate to form an oxidized substrate;

implanting oxygen into the substrate and spaced below the oxidized portion of the substrate; and annealing the substrate to form a contiguous field oxide layer, having a desired field oxide thickness.

14. The method of claim 13, wherein the field oxide is comprised of silicon dioxide.

15. The method of claim 13, wherein the semiconductor substrate is comprised of silicon.

16. The method of claim 13, wherein the substrate comprises silicon, having a silicon dioxide layer formed thereon.

17. The method of claim 13, wherein the mask layer is comprised of silicon nitride.

18. The method of claim 17, wherein the mask layer is formed to a thickness of between approximately 100 to 2,000 angstroms.

19. The method of claim 13, wherein the oxidizing step is performed at a pressure of between approximately $4 \times 10^3$ to $20 \times 10^3$ Torr.

20. The method of claim 13, wherein the oxidizing step is comprised of at temperature of between approximately 900 to 1,150 degrees Celsius in an oxidant selected from the group consisting of $O_2$, $O_3$, $CO_2$, $H_2O$, $N_2O$, NO.

21. The method of claim 13, wherein the oxidized substrate formed has a thickness of between approximately 750 to 1,500 angstroms.

22. The method of claim 13, wherein the oxygen is implanted to a depth of between approximately 1,000 to 10,000 angstroms.

23. The method of claim 13, wherein the oxygen is implanted at an energy of between approximately 100 to 500 keV.

24. The method of claim 13, wherein the annealing step comprises annealing in an atmospheric furnace between approximately 850 to 1,050 degrees Celsius for approximately 2 hours.

25. The method of claim 13, wherein the field oxide thickness is between approximately 1,000 to 10,000 angstroms.

26. A method for forming field oxide on a semiconductor substrate, comprising the steps of:

forming a patterned oxidation resistant layer on the substrate having at least one opening therein;

oxidizing the substrate at the at least one opening;

implanting oxygen into the opening substantially below the oxidized substrate; and oxidizing the substrate to form a unified layer of field oxide at the at least one opening, having a desired field oxide thickness.

27. A method for field oxide growth on a semiconductor substrate, comprising the steps of:

forming a patterned oxidation resistant layer over the substrate at a thickness of between approximately 100 to 2,000 angstroms having at least one opening therein exposing the substrate;

oxidizing the exposed substrate to form an oxidized substrate about the opening;

implanting oxygen into the oxidized substrate substantially below the oxidized substrate using an energy level of between approximately 100 to 500 KeV; and annealing the substrate in an atmospheric furnace between approximately 850 to 1,050 degrees Celsius for approximately 2 hours to form field oxide, having a desired field oxide thickness.

* * * * *